United States Patent
Lee et al.

(10) Patent No.: US 9,902,925 B2
(45) Date of Patent: Feb. 27, 2018

(54) CLEANER COMPOSITION FOR PROCESS OF MANUFACTURING SEMICONDUCTOR AND DISPLAY

(71) Applicants: Samsung Display Co., Ltd, Yongin-si, Gyeonggi-do (KR); LTCAM CO., LTD., Pyeongtack-si, Gyeonggi-do (KR)

(72) Inventors: Dong Eon Lee, Yongin-si (KR); Jin Ho Ju, Yongin-si (KR); Jun Hyuk Woo, Yongin-si (KR); Seok Ho Lee, Yongin-si (KR)

(73) Assignees: Samsung Display Co., Ltd. (KR); LTCAM CO., LTD. (KR)

( * ) Notice: Subject to any disclaimer, the term of this patent is extended or adjusted under 35 U.S.C. 154(b) by 73 days.

(21) Appl. No.: 14/964,267

(22) Filed: Dec. 9, 2015

(65) Prior Publication Data
US 2016/0215241 A1 Jul. 28, 2016

(30) Foreign Application Priority Data

Jan. 26, 2015 (KR) .................. 10-2015-0012299

(51) Int. Cl.
*C11D 7/32* (2006.01)
*C11D 7/08* (2006.01)
*C11D 7/26* (2006.01)
*C11D 11/00* (2006.01)
*C11D 3/39* (2006.01)
*C11D 3/395* (2006.01)
*H01L 21/02* (2006.01)

(52) U.S. Cl.
CPC .......... *C11D 7/3245* (2013.01); *C11D 3/3947* (2013.01); *C11D 3/3956* (2013.01); *C11D 7/08* (2013.01); *C11D 7/265* (2013.01); *C11D 7/3209* (2013.01); *C11D 11/0047* (2013.01); *H01L 21/02057* (2013.01)

(58) Field of Classification Search
CPC .................................. C11D 11/0047
See application file for complete search history.

(56) References Cited

U.S. PATENT DOCUMENTS

| | | | |
|---|---|---|---|
| 2004/0266171 A1* | 12/2004 | Aoki | H01L 21/02074 438/622 |
| 2008/0047592 A1 | 2/2008 | Fisher et al. | |
| 2009/0253603 A1 | 10/2009 | Uchiyama et al. | |
| 2010/0051066 A1 | 3/2010 | Kuwabara et al. | |
| 2010/0167972 A1* | 7/2010 | Kawase | C11D 3/2075 510/175 |
| 2015/0136728 A1* | 5/2015 | Kim | C11D 11/0047 216/13 |
| 2016/0230289 A1* | 8/2016 | Kim | C11D 11/0047 |

FOREIGN PATENT DOCUMENTS

| | | |
|---|---|---|
| KR | 10-2009-0025280 A | 3/2009 |
| KR | 10-1087916 B1 | 11/2011 |
| KR | 10-1349491 B1 | 1/2014 |
| KR | 1020140092077 A | 7/2014 |
| KR | 1020150056727 | 5/2015 |

* cited by examiner

*Primary Examiner* — Gregory E Webb
(74) *Attorney, Agent, or Firm* — Innovation Counsel LLP

(57) ABSTRACT

There is provided a cleaner composition for a process of manufacturing a semiconductor and a display. The cleaner composition includes 0.01 to 5.0 wt % of amino acid-based chelating agent, 0.01 to 1.5 wt % of organic acid, 0.01 to 1.0 wt % of inorganic acid, 0.01 to 5.0 wt % of alkali compound, and the balance of deionized water and is based on acidic water with pH levels of 1 to 5. The cleaner composition may enhance metal contaminants removal capability and have a function to remove particles and organic contaminants, and prevent corrosion of copper and reverse adsorption of copper. Thus, cleaner composition may be used for various purposes of etching copper, removing residues, and a cleaner by adjusting an etch rate.

17 Claims, No Drawings

CLEANER COMPOSITION FOR PROCESS OF MANUFACTURING SEMICONDUCTOR AND DISPLAY

CROSS-REFERENCE TO RELATED APPLICATION

This application claims priority to and the benefit of Korean Patent Application No. 10-2015-0012299, filed on Jan. 26, 2015, in the Korean Intellectual Property Office, the entire contents of which are incorporated herein by reference in their entirety.

BACKGROUND

1. Field

The present invention relates to a cleaner composition for a process of manufacturing a semiconductor and a display, and more particularly, to an acidic water-based cleaner composition for a process of manufacturing a semiconductor and a display.

2. Description of the Related Art

As information technology has rapidly advanced, large scale integrated circuits (LSI), ultra large scale integrated circuits (ULSI), and very large scale integrated circuits (VLSI) have become finer, have higher density, and are more highly integrated, and technologies based on multilayers of wirings have been developed. In order to achieve multilayers of wiring, it is required to reduce a pitch width of wirings and capacity between wirings, and to this end, copper (Cu) having low resistance has been recently used as a wiring material.

In order to enhance reliability of a device by removing contaminants such as particles, metal atoms, organic substances, and the like, generated during a process of manufacturing a semiconductor device, a cleaning process is performed. During the cleaning process, copper is corroded or reversely adsorbed, and it is difficult to enhance a function of removing particles or organic contaminants, while also preventing corrosion of copper and reverse adsorption of copper, with a related art cleaner composition.

Thus, an alkali water-based cleaner composition having pH 8 to 13 capable of removing metal contaminants and particles, preventing corrosion of copper, and preventing reverse adsorption of copper has been proposed, but this composition still has a problem that organic particle removing capability and inorganic particle removing capability of a particular film material are not sufficient.

SUMMARY

An acidic water-based cleaner composition capable of removing metal contaminants and organic and inorganic particles, enhancing inorganic particle removability of particular film material, preventing corrosion of copper and reverse adsorption of copper is provided.

A cleaner composition for a process of manufacturing a semiconductor and a display includes 0.01 to 5.0 wt % of amino acid-based chelating agent; 0.01 to 1.5 wt % of organic acid; 0.01 to 1.0 wt % of inorganic acid; 0.01 to 5.0 wt % of alkali compound; and the balance of deionized water, and is based on acidic water with pH levels of 1 to 5.

The amino acid-based chelating agent may be at least one selected from the group consisting of glycine, ethylenediaminetetraacetic acid, and cyclohexanediaminetetraacetic acid.

The organic acid may be at least one selected from the group consisting of a lactic acid, lactic acid alkyl ester, acetic acid, and acetic acid alkyl ester, and the inorganic acid may be a nitric acid or sulfuric acid.

The alkali compound may be at least one selected from the group consisting of tetramethylammonium hydroxide, tetrabutylammonium hydroxide, tetraethylammonium hydroxide, and trimethylammonium chloride.

The cleaner composition may further include 0.01 to 0.1 wt % of oxidizing agent, and the oxidizing agent may be at least one selected from the group consisting of hydrogen peroxide, sodium hypochlorite, chlorous acid, chlorine dioxide.

The cleaner composition may further include 0.01 to 5.0 wt % of benzotriazole-based corrosion inhibitor, and the benzotriazole-based corrosion inhibitor may be at least one selected from the group consisting of 6-chloro-1-methoxybenzotriazole, 2,2'-[(1H-benzotriazole-1-ylmethyl)imino]bisethanol, 1H-thiazolo [4,5-d]-1,2,3-triazole, 5-methyl-(9CI).

The cleaner composition may be based on subacidic water with pH levels of 3 to 5.

The cleaner composition according to example embodiments can simultaneously remove metal contaminants and organic/inorganic particles, enhance inorganic particle removability of particular film material, and prevent corrosion of copper and reverse adsorption of copper.

Thus, cleaner may be used for various purposes of etching copper, removing residues, and a cleaner, by adjusting an etch rate.

DETAILED DESCRIPTION

Example embodiments will now be described more fully hereinafter with reference to the accompanying drawings; however, they may be embodied in different forms and should not be construed as limited to the embodiments set forth herein.

A cleaner composition of an embodiment of the present disclosure, which is based on acidic water with pH levels of 1 to 5, capable of removing metal contaminants and organic/inorganic particles, preventing corrosion of copper, and preventing reverse adsorption, includes 0.01 to 5.0 wt % of amino acid-based chelating agent; 0.01 to 1.5 wt % of organic acid; 0.01 to 1.0 wt % of inorganic acid; 0.01 to 5.0 wt % of alkali compound, and the balance of ultra-pure water.

Also, in the cleaner composition of an embodiment of the present disclosure, an oxidizing agent may be added within a range from 0.01 to 0.1 wt % to replace a portion of the inorganic acid of the foregoing composition, and the oxidizing agent may serve to adjust an etching rate and enhance removability of metal contaminants.

The cleaner composition of an embodiment of the present disclosure removes metal contaminants using the chelating agent and the inorganic acid, and the removed metal may be bonded with a buffering agent to form an oxygen or nitrogen compound.

In order to obtain an organic/inorganic particle removing effect, the cleaner composition of an embodiment of the present disclosure includes an acid solvent with pH levels of 1 to 5, preferably, pH levels of 3 to 5. First, the organic/inorganic particles Van-Der-Waals forces act on a surface of copper and subsequently etched together with a ligand capillary phenomenon of the chelating agent and easily removed by electrostatic repulsion force. Also, the organic/inorganic particle removing effect is increased by using an oxidizing agent and inorganic particle removability with respect to particular film material is enhanced.

Also, in the cleaner composition of an embodiment of the present disclosure, the copper corrosion preventing and reverse adsorption preventing function may be described with an acid solvent. When pH levels are 5.5 to 14, local corrosion occurs due to a $HCuO_2^-$ parallel reaction based on formation of a copper oxide and an increase in pH, and when pH levels are 14 or above, copper is changed into $HCuO_2^-$ to cause general corrosion. Thus, in the present disclosure, an acid solvent with pH levels of 1 to 5 having excellent impurity removability such as particles, or the like, compared with neutral and alkali by removing impurities through wet etching. More preferably, the acid solvent is a subacid solvent with pH levels of 3 to 5.

Also, in the cleaner composition of an embodiment of the present disclosure, a soaking solution effect with a buffering agent may be described in order to continuously maintain performance and prevent a change in polarity on a surface of copper. Here, when a ligand of the chelating agent is separated as M+ from the surface of copper, an M—N or M—O compound is formed using a buffering agent in order to prevent reverse adsorption, and this is called a soaking solution function.

Also, the cleaner composition of an embodiment of the present disclosure may adjust a copper etch rate by using a rate of deionized water and solves problems such as a residual quantity of a material after cleaning, copper damage, and a residual.

In the cleaner composition for a process of manufacturing a semiconductor and a display according to an embodiment of the present disclosure, the amino acid-based chelating agent may be at least one selected from the group glycine, ethylenediaminetetraacetic acid, and cyclohexanediaminetetraacetic acid.

Also, the organic acid may be at least one selected from the group a lactic acid, lactic acid alkyl ester, acetic acid, and acetic acid alkyl ester, and the inorganic acid may be a nitric acid or sulfuric acid.

Also, the alkali compound may be at least one selected from the group tetramethylammonium hydroxide, tetrabutylammonium hydroxide, tetraethylammonium hydroxide, and trimethylammonium chloride.

The cleaner composition for a process of manufacturing a semiconductor and a display according to an embodiment of the present disclosure may further include 0.01 to 0.1 wt % of oxidizing agent, and the oxidizing agent may be at least one selected from the group hydrogen peroxide, sodium hypochlorite, chlorous acid, chlorine dioxide.

Also, the cleaner composition for a process of manufacturing a semiconductor and a display according to an embodiment of the present disclosure may further include 0.01 to 5.0 wt % of benzotriazole-based corrosion inhibitor, and the benzotriazole-based corrosion inhibitor may be at least one selected from the group 6-chloro-1-methoxy-benzotriazole, 2,2'-[(1H-benzotriazole-1-ylmethypimino] bisethanol, 1H-thiazolo[4,5-d]-1,2,3-triazole, 5-methyl-(9CI).

Hereinafter, the inventive concept will be described in more detail with reference to examples, but the present invention is not limited thereto.

EXAMPLE 1

A composition including 4 wt % of ethylenediaminetetraacetic acid as an amino acid-based chelating agent, 1 wt % of acetic acid as an organic acid, 0.5 wt % of nitric acid as an inorganic acid, 3.5 wt % of tetramethylammonium hydroxide as a alkali compound, and 91 wt % of deionized water was prepared, diluted by 10 times with deionized water, evaluated with respect to copper glass, and results thereof are shown in Table 1.

EXAMPLE 2

The same composition was prepared except that 0.01 wt % (10 ppm) of hydrogen peroxide was used instead of 0.5 wt % of nitric acid as an inorganic acid in Example 1, diluted by 10 times with deionized water, evaluated with respect to copper glass, and the results thereof are shown in Table 1.

COMPARATIVE EXAMPLES 1 AND 2

Copper glass of Comparative Example 1 was evaluated by using 100 wt % of deionized water, and a composition including 0.4 wt % of Tetramethylammonium Hydroxide (TMAH) as a alkali compound and 99.6 wt % of deionized water, evaluated with respect to copper glass, and the results thereof are shown in Table 1.

TABLE 1

| Item | Comparative Example 1 (DIW) | Comparative Example 2 (TMAH 0.4 wt %) | Example 1 | Example 2 |
|---|---|---|---|---|
| Etch rate of copper | 0.95 Å/min (@ 25° C.) | 4.99 Å/min (@ 25° C.) | 3.4 Å/min (@ 25° C.) | 4.4 Å/min (@ 25° C.) |
| Wet-ability | ○ | X | ○ | ○ |
| Spread-ability | 4.0 mm | 8.0 mm | 6.8 mm | 7.1 mm |
| Foam & De-foam | ◎ | ○ | ◎ | ◎ |
| Removal of particle and reverse adsorption | Δ | Δ | ◎ | ◎ |
| CopperDamage and Residual | Cu is not corroded | Cu is corroded | Cu is not corroded | Cu is not corroded |
| Removability of organic dust | ○ | ○ | ◎ | ◎ |
| Removability of metal impurity | Δ | ◎ | ◎ | ◎ |

◎: Excellent,
○: Good,
Δ: Acceptable,
X: Bad

Through Table 1, it can be seen that Examples 1 and 2 according to the present disclosure do not have copper corrosion and have excellent organic/inorganic particle removability, compared with Comparative Example 1.

EXAMPLE 3

The same composition as that of Example 1 was prepared and 0.01 wt % (10 ppm) (Example 3A), 0.05 wt % (50 ppm) (Example 3B), and 0.1 wt % (100 ppm)(Example 3C) of hydrogen peroxide as an oxidizing agent were added instead of nitric acid as an inorganic acid, and diluted by 10 times with deionized water, and etch rate (E/R), pH, and particles were counted (P/C) and evaluated. The results are shown in Table 2, and those of Comparative Examples 1 and 2 were also evaluated for comparison.

TABLE 2

| Classification | E/R(Å/min) | pH | P/C Removal |
|---|---|---|---|
| Comparative Example 1 | 1.19 | 6.23 | 0% (192% increased) |
| Comparative Example 2 | 4.98 | 12.42 | 51.4% reduced |
| <Example 3A><br>0.01 wt % of oxidizing agent and diluted by 10 times | 4.40 | 4.06 | 84.9% reduced |
| <Example 3B><br>0.05 wt % of oxidizing agent and diluted by 10 times | 6.34 | 4.15 | 92.0% reduced |
| <Example 3C><br>0.1 wt % of oxidizing agent and diluted by 10 times | 8.40 | 4.10 | 94.5% reduced |

An addition rate of an oxidizing agent may be determined by using an etch rate according to processes from the results of Table 2, and fine particles and metal contaminant removability may be improved by adjusting pH, and also, an etch rate (E/R) fitting to conditions of various processes may be adjusted.

EXAMPLE 4

The same composition as that of Example 1 was prepared and 0.05 wt % (50 ppm) of hydrogen peroxide was added instead of a nitric acid as an inorganic acid, and subsequently diluted with deionized water twice (Example 4A), five times (Example 4B), 10 times (Example 4C), and 20 times (Example 4D). Glass particles were measured in a demo process and the results are shown in Table 3. Also, the results are compared with Comparative Examples 1 and 2 for comparison evaluation (Order of demo process: treatment with chemicals, followed by a first, second and third washing were performed, and thereafter, each pH, E/R, and glass particles were measured and comparatively evaluated).

TABLE 3

| Classification | pH | E/R(A/min) | Particle removal rate (%) |
|---|---|---|---|
| Comparative Example 1 | 6.23 | 1.19 | 0%(192% increased) |
| Comparative Example 2 | 12.42 | 4.98 | 51.4% reduced |
| <Example 4A><br>50 ppm of oxidizing agent and diluted by two times | 4.22 | 6.91 | 98.4% reduced |
| <Example 4B><br>50 ppm of oxidizing agent and diluted by five times | 4.18 | 6.56 | 95.1% reduced |
| <Example 4C><br>50 ppm of oxidizing agent and diluted by ten times | 4.15 | 6.34 | 92.0% reduced |
| <Example 4D><br>50 ppm of oxidizing agent and diluted by twenty times | 4.20 | 5.92 | 87.2% reduced |

A dilution rate may be determined by using an etch rate according to the process through Example 4, and as can be seen in the previous process, characteristics of the copper surface are that particles may increase so as to cause spotting defects in many portions of fine line widths, and this drawback may be circumvented through the present inventive concept.

EXAMPLE 5

The same composition as that of Example 1 was prepared in the same manner as that of Example 1, 0.1 wt % (100 ppm) of hydrogen peroxide as an oxidizing agent was added instead of the nitric acid as an inorganic acid, and diluted by 10 times with deionized water so as to be prepared. Glass particles were measured with respect to various film material in a demo process and results thereof are shown in Table 4. Also, for comparative evaluation, Comparative Example 1 and Comparative Example 2 were comparatively evaluated (Order of demo process: treatment with chemicals followed by a first, second and third washing were performed, and thereafter, glass particles were measured and evaluated for comparison).

TABLE 4

| Classification | | Before | After | |
|---|---|---|---|---|
| Chemicals | Film material | cleaned P/C | cleaned P/C | Removal rate (%) |
| Comparative Example 1 | copper | 578 | 690 | 0%(119.4% increased) |
| Example 5A (diluted Example 1 by 10 times) | | 531 | 131 | 74.9% |
| Comparative Example 2 | | 537 | 261 | 51.4% |
| Example 5B (diluted Example 1 by 10 times with addition of oxidizing agent) | | 591 | 109 | 81.2% |
| Comparative Example 1 | IZO | 114 | 80 | 29.8% |
| Example 5C (diluted Example 1 by 10 times) | | 251 | 78 | 68.9% |
| Comparative Example 2 | | 120 | 56 | 53.3% |
| Example 5D (diluted Example 1 by 10 times with addition of oxidizing agent) | | 247 | 54 | 78.1% |
| Comparative Example 1 | ITO | 555 | 369 | 33.5% |
| Example 5E (diluted Example 1 by 10 times) | | 335 | 198 | 61.2% |
| Comparative Example 2 (diluted Example 1 by 10 times with addition of oxidizing agent) | | 255<br>445 | 99<br>116 | 40.9%<br>74.0% |

It can be seen from Table 4 that the clear composition according to the present inventive concept enhances inorganic particle removability with respect to various film material.

EXAMPLE 6

A composition which was the same as Example 1 but includes 0.1 wt % (100 ppm) of hydrogen peroxide as an oxidizing agent instead of nitric acid as an inorganic acid was prepared and diluted by 10 times with deionized water. Organic and inorganic particles were measured in a demo process and evaluated and the results are shown in Table 5. Also, for comparative evaluation, Comparative Examples 1 and 2 are used for comparison (Order of comparative process: treatment with chemicals followed by a first, second, and third washing were performed, and thereafter, particles of organic/inorganic contaminants were measured and comparatively evaluated). Also, as contaminants, 0.01 wt % of nickel powder, 1 wt % of erucamide & 0.01 wt % of soybean oil were used.

TABLE 5

| Classification | | Before | After | |
|---|---|---|---|---|
| Chemicals | Contaminant source | cleaned P/C | cleaned P/C | Removal rate (%) |
| Comparative Example 1 | Nickel powder | 434 | 617 | 0%(142.2% increased) |
| Comparative Example 2 | | 542 | 294 | 45.8% |
| Example 6) | | 493 | 89 | 82.0% |
| Comparative Example 1 | Erucamide | 311 | 446 | 0%(143.0% increased) |
| Comparative Example 2 | | 601 | 451 | 25.0% |
| Example 6 | | 535 | 136 | 74.6% |
| Comparative Example 1 | Soybean oil | 493 | 428 | 13.2% |
| Comparative Example 2 | | 672 | 422 | 37.2% |
| Example 6 | | 570 | 175 | 69.3% |

It can be seen from the results of Table 5 that the cleaner composition according to the present inventive concept has excellent particle removability and stably removes organic/inorganic particles.

EXPERIMENTAL EXAMPLE 7

A composition which was the same as Example 1, but includes 0.1 wt % (100 ppm) of hydrogen peroxide as an oxidizing agent instead of nitric acid as an inorganic acid was prepared and diluted by 10 times with deionized water (Example 7A), and a composition in which the tetramethylammonium hydroxide (TMAH) as a alkali compound was adjusted to be 15 wt % (Example 7B) and a composition in which the content of the organic acid was adjusted to 2 wt % in the composition of Example 1 (Example 7C) were each diluted by 14 times with deionized water so as to be prepared, a Cu elution test was performed and compared with ICP. The results are shown in Table 6.

TABLE 6

| Cu elution time | 5 min. (ppb) | 15 min. (ppb) | 30 min. (ppb) |
|---|---|---|---|
| Comparative Example 1 | 0.114 | 0.204 | 0.512 |
| Example 7A (0.1 wt % of oxidizing agent and diluted by 10 times) | 0.090 | 0.240 | 0.397 |
| Example 7B (Composition in which 15 wt % of TMAH was adjusted) | 0.662 | 1.017 | 1.946 |
| Example 7C (Composition in which 2 wt % of organic acid was adjusted) | 0.44 | 0.63 | 0.799 |

It can be seen that, in Example 7B in which 15 wt % of TMAH was added to have a pH levels of 13 and above, after copper was eluted, it was corroded to HCuO2−, increasing an elution quantity, and meanwhile, in the composition to be acidic with pH levels of 8 and below by adding the organic acid, Cu was re-adsorbed after being eluted, increasing a small amount of elution quantity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the disclosure, including the following claims.

What is claimed is:

1. A cleaner composition for a process of manufacturing a semiconductor and a display, the cleaner composition comprising:
   0.01 to 5.0 wt % of amino acid-based chelating agent;
   0.01 to 1.5 wt % of organic acid;
   0.01 to 1.0 wt % of inorganic acid;
   0.01 to 5.0 wt % of alkali compound; and
   the balance of deionized water,
   wherein the cleaner composition is based on acidic water with pH levels of 1 to 5.

2. The cleaner composition as claimed in claim 1, wherein the amino acid-based chelating agent is at least one selected from the group consisting of glycine, ethylenediaminetetraacetic acid, and cyclohexanediaminetetraacetic acid.

3. The cleaner composition as claimed in claim 1, wherein the organic acid is at least one selected from the group consisting of a lactic acid and acetic acid.

4. The cleaner composition as claimed in claim 1, wherein the inorganic acid is a nitric acid or sulfuric acid.

5. The cleaner composition as claimed in claim 1, wherein the alkali compound is at least one selected from the group consisting of tetramethylammonium hydroxide, tetrabutylammonium hydroxide, tetraethylammonium hydroxide, and trimethylammonium chloride.

6. The cleaner composition as claimed in claim 1, further comprising 0.01 to 0.1 wt % of oxidizing agent, wherein the oxidizing agent is at least one selected from the group consisting of hydrogen peroxide, sodium hypochlorite, chlorous acid, chlorine dioxide.

7. The cleaner composition as claimed in claim 1, further comprising 0.01 to 5.0 wt % of benzotriazole-based corrosion inhibitor.

8. The cleaner composition as claimed in claim 7, wherein the benzotriazole-based corrosion inhibitor is at least one selected from the group consisting of 6-chloro-1-methoxy-benzotriazole, 2,2'-[(1H-benzotriazole-1-ylmethyl)imino] bisethanol.

9. The cleaner composition as claimed in claim 1, wherein the cleaner composition is based on subacidic water with pH levels of 3 to 5.

10. A cleaner composition for a process of manufacturing a semiconductor and a display, the cleaner composition comprising:
   0.01 to 5.0 wt % of amino acid-based chelating agent;
   0 01 to 1.5 wt % of organic acid;
   0.01 to 0.1wt % of oxidizing agent;
   0.01 to 5.0 wt % of alkali compound; and
   the balance of deionized water,
   wherein the cleaner composition is based on acidic water with pH levels of 1 to 5.

11. The cleaner composition as claimed in claim 10, wherein the amino acid-based chelating agent is at least one selected from the group consisting of glycine, ethylenediaminetetraacetic acid, and cyclohexanediaminetetraacetic acid.

12. The cleaner composition as claimed in claim 10, wherein the organic acid is at least one selected from the group consisting of a lactic acid and acetic acid.

13. The cleaner composition as claimed in claim 10, wherein the alkali compound is at least one selected from the group consisting of tetramethylammonium hydroxide, tetrabutylammonium hydroxide, tetraethylammonium hydroxide, and trimethylammonium chloride.

14. The cleaner composition as claimed in claim 10, wherein the oxidizing agent is at least one selected from the group consisting of hydrogen peroxide, sodium hypochlorite, chlorous acid, chlorine dioxide.

15. The cleaner composition as claimed in claim 10, further comprising 0.01 to 5.0 wt % of benzotriazole-based corrosion inhibitor.

16. The cleaner composition as claimed in claim 15, wherein the benzotriazole-based corrosion inhibitor is at least one selected from the group consisting of 6-chloro-1-methoxy-benzotriazole, 2,2'-[(1H-benzotriazole-1-ylmethyl)imino]bisethanol.

17. The cleaner composition as claimed in claim 10, wherein the cleaner composition is based on subacidic water with pH levels of 3 to 5.

\* \* \* \* \*